(12) United States Patent
Nishimoto

(10) Patent No.: US 6,197,611 B1
(45) Date of Patent: Mar. 6, 2001

(54) METHOD FOR PRODUCING SILICON SOLAR CELL

(75) Inventor: Yoichiro Nishimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/304,957

(22) Filed: May 5, 1999

(30) Foreign Application Priority Data

Dec. 17, 1998 (JP) .................................................. 10-359025

(51) Int. Cl.$^7$ .................................................. H01L 21/00
(52) U.S. Cl. .......................... 438/57; 438/753; 438/964; 136/256; 136/258
(58) Field of Search .................................. 439/57, 96, 97, 439/745, 753, 964; 136/206, 256, 758, 261

(56) References Cited

U.S. PATENT DOCUMENTS 5,759,292 * 6/1998 Arimoto et al. ...................... 136/256
6,072,117 * 6/2000 Matsuyama et al. ................. 136/256

OTHER PUBLICATIONS

Zaidi et al., "Si Texturing with Sub–Wavelength Structures," IEEE 26th PVSC, pp. 171–174, Oct. 1997.*
Einhaus et al., "Isotropic Texturing of Multicrystalline Silicon Wafers with Acipic Texturing Solutions," IEEE 26$^{th}$ PVSC, pp. 167–170, Oct. 1997.*
Hylton et al., "Determination of Fact Orientations of Alkaline Etched Multicrystalline Wafers," IEEE 25th PVSC, pp. 725–732, May 1996.*
Stocks et al. "Texturing of Polycrystalline Silicon," IEEE First WCPEC, pp. 1551–1554, Dec. 1994.*
Photovoltaic Solar Energy Conference, Proceedings of the International Conference, Jun. 30, 1997–Jul. 4, 1997, vol. 1, pp. 812–815.

* cited by examiner

Primary Examiner—Kevin M. Picardat

(57) ABSTRACT

The present invention provides a method for producing a solar cell comprising the step of immersing a silicon substrate in an etching solution which includes an aqueous sodium carbonate ($Na_2CO_3$) solution, optionally an aqueous sodium hydroxide (NaOH) solution and/or an aqueous sodium bicarbonate ($NaHCO_3$) solution to form minute concave and convex patterns on the surface of the silicon substrate. This method allows quite uniform textures to be formed on the crystal faces while avoiding the problem of disposal of isopropyl.

7 Claims, 4 Drawing Sheets

METHOD FOR PRODUCING SILICON SOLAR CELL

BACKGROUND OF THE INVENTION

1. Field of the Invention

The present invention relates to a method for producing a crystalline silicon solar cell, and in more detail relates to a method for producing a high performance solar cell with a low production cost.

2. Description of the Related Art

Concave and convex patterns with a minute pyramidal (square pyramidal) shape called as a texture are formed on the surface of the crystalline silicon solar cell. The light reflected from one spot impinges again to the other spot of the surface of the crystalline solar cell by virtue of the texture structure composed of these inclined pyramidal surfaces, penetrating into the solar cell to be effectively absorbed in the solar cell. Although a portion of the impinging light that has not been fully absorbed but arrives at the back face of the solar cell is reflected back to the surface again, it can be reflected again at the surface comprising steeply inclined pyramidal surfaces, thereby confining the light in the solar cell to improve absorption of light and to enhance power generation.

The texture structure was formed in the conventional art by immersing the silicon wafer exposing (100) face into a mixed solution prepared by adding 5 to 30% by volume of isopropyl alcohol into an aqueous solution of sodium hydroxide (NaOH) or potassium hydroxide (KOH), warmed at a temperature of 60 to 95° C. with a concentration of several to more than ten percent. The etching speed with an alkali solution is the fastest on the (100) face of silicon and the slowest on the (111) face. Accordingly, when the (111) face accidentally appears during etching process of the (100) face as an initial face, the (111) face with slow etching speed is advantageously left on the surface. Since this (111) face is inclined by about 54 degree against the (100) face, pyramidal projections constituted of the (111) face and its equivalent faces are formed.

However, it was a problem that the method as described above requires a high process cost because the process uses isopropyl alcohol (IPA) as well as a high disposal cost of its drainage containing alcohol.

A method for forming textures with an aqueous solution of potassium carbonate ($K_2CO_3$) was presented at the 14th EUROPEAN PHOTOVOLTAIC SOLAR ENERGY CONFERENCE (BARCELONA, 1997) for solving the foregoing problem. In this method, silicon is etched in an aqueous solution of potassium carbonate ($K_2CO_3$) with a concentration of 1 to 30% by weight heated at 90 to 100° C. According to the report, the lowest reflectance (a mean reflectance of 12.3% at 400 to 1100 nm) was obtained by an etching using 30% by weight of an etching solution under the condition of 100° C. for 30 minutes.

The conventional art involves a problem that the method as described above requires a high process cost because the process uses isopropyl alcohol (IPA) as well as a high disposal cost of its drainage containing an alcohol. The method for forming textures using potassium carbonate ($K_2CO_3$) was presented for solving the foregoing problems. However, an examination for confirming the above result revealed that, although good textures are formed, uniformity of the pyramidal projections on the surface was poor.

SUMMARY OF THE INVENTION

Accordingly, an object of the present invention is to provide a method for producing a silicon solar cell capable of producing the solar cell having a high luminous energy efficiency with a low production cost without using isopropyl alcohol (IPA) while forming highly uniform textures on the crystal face.

The present invention provides a method for producing a solar cell comprising the step of immersing a silicon substrate into an etching solution to form minute concave and convex patterns on the surface of the silicon substrate, wherein the etching solution is an aqueous solution containing sodium carbonate ($Na_2CO_3$).

The present invention also provides the above method wherein a concentration of sodium carbonate ($Na_2CO_3$) is preferably 8 to 23% by weight (a saturated solution).

The present invention also provides the above method wherein a temperature of the aqueous sodium carbonate ($Na_2CO_3$) solution is 80 to 100° C.

The present invention also provides a method for producing a silicon solar cell comprising the step of immersing a silicon substrate into a mixed etching solution to form minute concave and convex patterns on the surface of the silicon substrate, wherein the etching solution is a mixed solution of the aqueous sodium carbonate ($Na_2CO_3$) solution and an aqueous sodium hydroxide (NaOH) solution.

The present invention also provides a method for producing a silicon solar cell comprising the step of immersing a silicon substrate into a mixed etching solution to form minute concave and convex patterns on the surface of the silicon substrate, wherein the etching solution is a mixed solution of the aqueous sodium carbonate ($Na_2CO_3$) solution and an aqueous sodium bicarbonate ($NaHCO_3$) solution.

The present invention also provides a method for producing a silicon solar cell comprising the step of immersing a silicon substrate into a mixed etching solution to form minute concave and convex patterns on the surface of the silicon substrate, wherein the etching solution is a mixed solution of the aqueous sodium carbonate ($Na_2CO_3$) solution, aqueous sodium bicarbonate ($NaHCO_3$) solution and aqueous sodium hydroxide (NaOH).

The present invention also provides the above method further comprising the step of immersing the silicon substrate in an acid after forming minute concave and convex patterns on the surface of the silicon substrate.

In accordance with the method of the present invention, minute concave and convex patterns with high uniformity can be formed on the crystal face with a low production cost to provide a solar cell with high luminous energy efficiency, along with lowering the production cost including the cost of drainage disposal.

DESCRIPTION OF THE PREFERRED EMBODIMENT

Embodiment 1

One embodiment according to the present invention comprises a method for forming minute concave and convex patterns on the surface of silicon by immersing it into an aqueous sodium carbonate ($Na_2CO_3$) solution.

Forming the textures is influenced by the temperature and concentration of the aqueous sodium carbonate ($Na_2CO_3$) solution, and by the etching time. Tables 1 and 2 show the concentration dependence of the mean reflectance under a constant etching temperature of 100° C. and the etching temperature dependence (80 to 95° C.) of the mean reflectance under a constant concentration, respectively. A single crystal of the silicon wafer (crystal face along the (100) direction) was used in the experiment and mean values of the reflectance at the frequency region from 400 through 1100 nm were calculated for comparison.

TABLE 1

$Na_2CO_3$ Concentration Dependence of Mean Reflectance

| $Na_2CO_3$ (wt %) | 10 min | 20 min | 30 min |
| --- | --- | --- | --- |
| 8 | 15.12 | 11.44 | 11.69 |
| 10 | 12.40 | 11.02 | 11.19 |
| 12 | 11.88 | 10.97 | 11.09 |
| 15 | 11.19 | 11.14 | 11.35 |
| Sat. solution (~23%) | 11.23 | 11.05 | 12.38 |

TABLE 2

Etching Temperature Dependence of Mean Reflectance

| | 10 min | 15 min | 20 min | 30 min |
| --- | --- | --- | --- | --- |
| 15.15% by weight | | | | |
| 80° C. | 26.09 | | | 12.36 |
| 90° C. | 12.19 | | 11.02 | 11.02 |
| 95° C. | 11.61 | | 11.29 | 11.29 |
| 20% by weight | | | | |
| 90° C. | 18.70 | | 11.90 | 11.37 |
| 95° C. | 11.25 | | 10.98 | 11.16 |
| 98° C. | 11.11 | | | |
| Sat. Solution (~23%) | | | | |
| 90° C. | 21.56 | | 11.96 | 11.54 |
| 95° C. | 13.93 | 11.24 | 11.27 | |

The minimum mean reflectance of about 10 to 11% as shown in TABLE 1 and 2 seems to suggest that good textures was formed. While the experiments were carried out in the temperature range of 80 to 100° C. and concentration range of 8 to 23% by weight, it can be in principle concluded that the higher temperature allows better textures to be formed. While textures are formed at a concentration of as low as 8% by weight, the reflectance becomes small as the etching time period is increased (although the reflectance is 15.12% at the etching time of 10 minutes at 100° C. it is reduced to 11.69% at the etching time of 30 minutes), good textures are formed by elongating the etching time period.

However, the range of the etching time is limited since a relatively short etching time is desirable from the view point of mass productivity. It is desirable that the concentration of the etching solution is in the range of 8 to 23% by weight (the concentration of the saturated aqueous solution) for forming good textures within 30 minutes as a standard, the desirable temperature range being 80 to 100° C.

Figure 1:
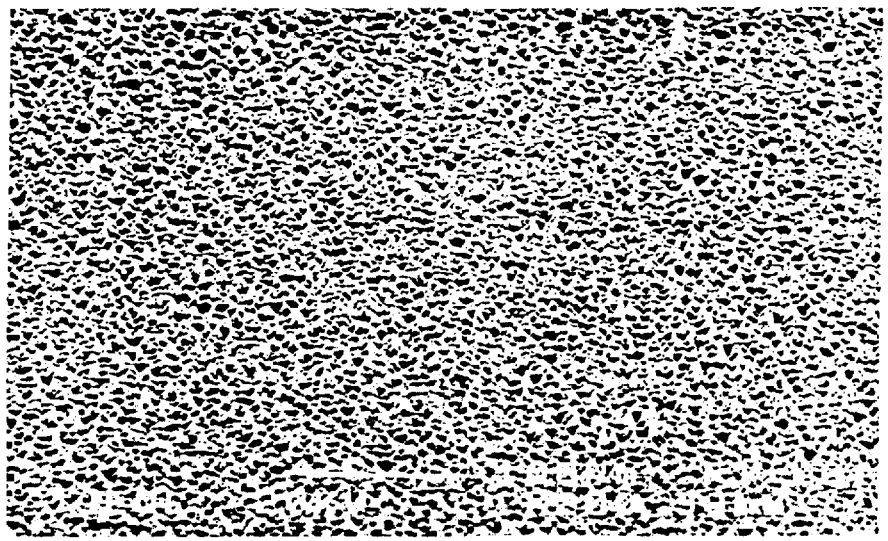
FIG. 1 is an electron microscopic photograph showing one example of the texture structure of the silicon wafer formed by using an aqueous sodium carbonate ($Na_2CO_3$) solution.
Figure 2:
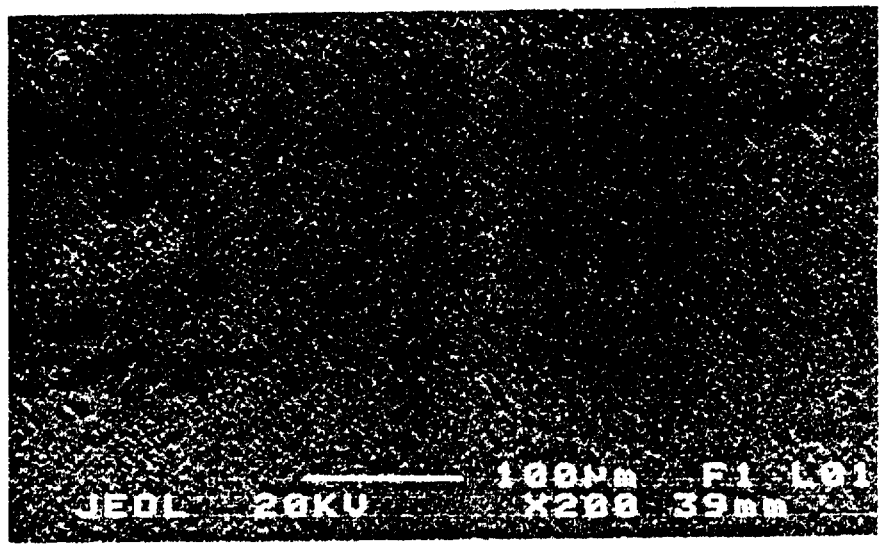
FIG. 2 shows an electron microscopic photograph showing one example of the texture structure of the silicon wafer formed by using an aqueous potassium carbonate ($K_2CO_3$) solution.
Figure 3:
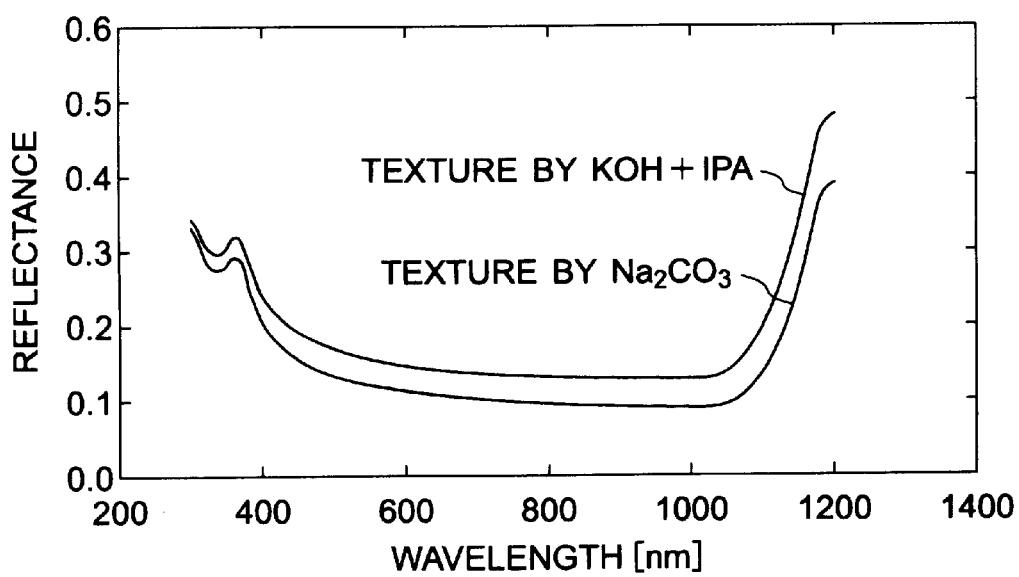
FIG. 3 is a graph illustrating a typical reflectance spectrum of the texture structure of the silicon wafer formed by using an etching solution prepared by adding isopropyl alcohol into an aqueous potassium hydroxide (KOH) solution or an etching solution comprising sodium carbonate ($Na_2CO_3$).

FIG. 1 is an electron microscopic photograph showing one example of the texture structure of the wafer formed by using an aqueous solution of sodium carbonate ($Na_2CO_3$). FIG. 2 is an electron microscopic photograph showing one example of the texture structure of the wafer formed by using an aqueous solution of potassium carbonate ($K_2CO_3$). FIG. 3 as a reference shows a typical reflectance spectra of the texture structures of the silicon wafer produced by using an etching solution prepared by adding isopropyl alcohol (IPA) into the potassium hydroxide (KOH) solution or by using an etching solution comprising the sodium carbonate ($Na_2CO_3$) solution. The texture structures shown in FIG. 1 and FIG. 2 are formed under the same etching condition, respectively. It is evident from FIG. 1 and FIG. 2 that the texture structure obtained by using the aqueous sodium carbonate ($Na_2CO_3$) solution has a better uniformity on the crystal surface than that obtained by using the aqueous potassium carbonate ($K_2CO_3$) solution. The former method is advantageous in forming good textures with less consumption of chemicals. When etching processing is continuously carried out without changing the etching solution, it is recommended that water being evaporated off during the processing or the etching solution is supplemented.

While the case when a single crystal wafer is used was described above, the same effect can be obtained by applying the method to the polycrystalline silicon wafer, although the reflectance is somewhat increased since it depends on the orientation of the crystal face of the polycrystalline wafer.

Although the process may be started from the step for forming the textures for producing solar cells using the single crystal wafer, an elimination step of remaining slicing damages is required when a polycrystalline wafer is used. The damages may be removed with an aqueous solution of sodium hydroxide (NaOH) or potassium hydroxide (KOH) in the step independent from the texture forming step, or the damages can be eliminated by elongating the texture etching time period. The solar cell is produced by applying a diffusion treatment and reflection-preventive film forming treatment thereafter.

Embodiment 2

Textures can be also formed by using an etching solution prepared by adding a small amount of sodium hydroxide (NaOH) into the aqueous sodium carbonate ($Na_2CO_3$) solution described in Embodiment 1.

Figure 4A:
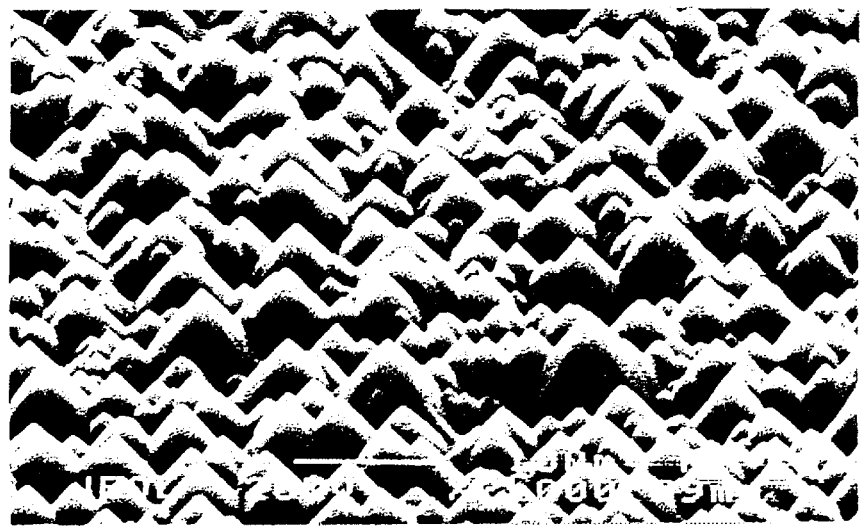
FIG. 4(a) is an electron microscopic photograph showing one example of the texture structure of the silicon wafer formed by using an aqueous sodium carbonate ($Na_2CO_3$) solution (wherein the concentration of sodium carbonate is 15% by weight, the temperature of the aqueous solution is 95° C. and the etching time is 10 minutes).
Figure 4B:
FIG. 4(b) is an electron microscopic photograph showing one example of the texture structure of the silicon wafer formed with a mixed solution prepared by adding an aqueous sodium hydroxide (NaOH) solution into an aqueous sodium carbonate ($Na_2CO_3$) solution (wherein the concentration of sodium carbonate is 14.92% by weight, the concentration of sodium hydroxide is 0.49%, the temperature of the aqueous solution is 95° C. and the etching time is 10 minutes).

FIG. 4(a) shows an example of the electron microscopic photograph of the texture structure of the silicon wafer produced by using an aqueous sodium carbonate ($Na_2CO_3$) solution (the concentration of sodium carbonate is 15% by weight, the temperature of the aqueous solution is 95° C. and the etching time is 10 minutes). FIG. 4(b) shows an example of the electron microscopic photograph of the texture structure of the silicon wafer produced by using a mixed solution prepared by adding an aqueous sodium hydroxide (NaOH) solution into an aqueous sodium carbonate ($Na_2CO_3$) solution (the concentration of sodium carbonate is 14.92% by weight, the concentration of sodium hydroxide is 0.49%, the temperature of the aqueous solution is 95° C. and the etching time is 10 minutes).

Figure 5:
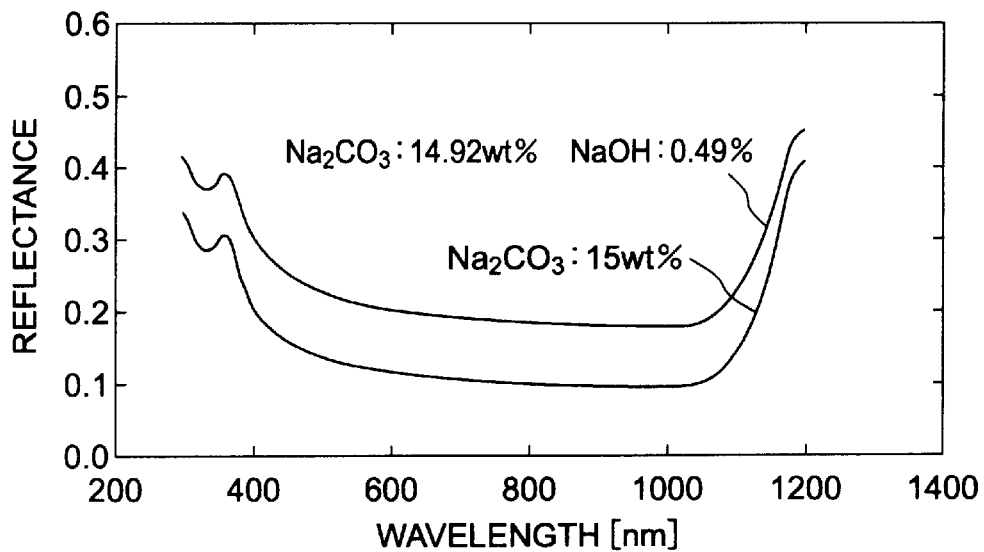
FIG. 5 shows a comparison of the reflectance with and without sodium hydroxide (NaOH) treatments.

FIG. 5 indicates a comparison of reflectance of the silicon wafers produced using etching solutions with and without sodium hydroxide (NaOH), respectively. The mean reflectance is shown in TABLE 3 below.

TABLE 3

Comparison of Mean Reflectance of the Silicon Wafers Produced Using Etching Solutions with and without Sodium Hydroxide (NaOH)

|  | 95° C., 10 min |
|---|---|
| 15 wt % $Na_2CO_3$ ($Na_2CO_3$: 150 g, $H_2O$: 850 cc) | 12.09 |
| 15 wt % $Na_2CO_3$, 0.49 wt % NaOH ($Na_2CO_3$: 150 g, NaOH: 5 g, $H_2O$: 850 cc) | 20.57 |

The results shown in FIG. 4, FIG. 5 and TABLE 3 indicate that, while textures are formed by adding sodium hydroxide (0.49% by weight), the texture density becomes sparse to increase the reflectance, showing that the amount of addition of sodium hydroxide (NaOH) should be as small as 0.5% by weight or less of the overall quantity of the etching solution.

Embodiment 3

Textures can be formed using a solution prepared by adding sodium bicarbonate ($NaHCO_3$) into an aqueous sodium carbonate ($Na_2CO_3$) solution according to Embodiment 1 as an etching solution.

Figure 6:
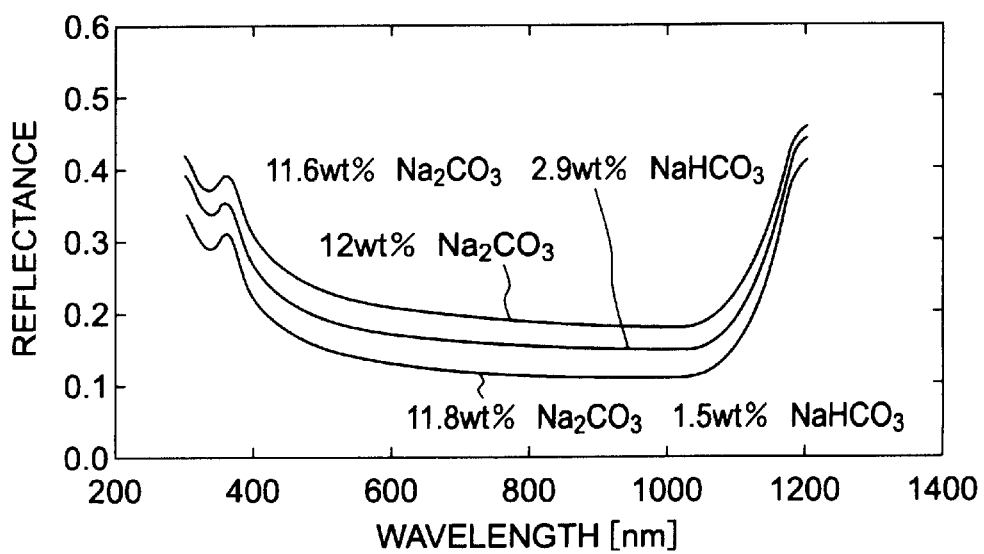
FIG. 6 shows a comparison of the reflectance with and without addition of sodium bicarbonate ($NaHCO_3$) into the aqueous sodium carbonate ($Na_2CO_3$) solution with a concentration of 12% by weight.

FIG. 6 shows a comparison of reflectance of the wafers treated with 12% by weight of an aqueous sodium carbonate ($Na_2CO_3$) solution with and without addition of sodium bicarbonate ($NaHCO_3$). The mean reflectance is shown in TABLE 4 below.

TABLE 4

$NaHCO_3$ Concentration Dependence of Mean Reflectance

|  | 95° C., 10 minutes |
|---|---|
| 12 wt% $Na_2CO_3$ ($Na_2CO_3$: 120 g, $H_2O$: 880 cc) | 20.51 |
| 11.8 wt % $Na_2CO_3$, 1.5 wt % $NaHCO_3$ ($Na_2CO_3$: 120 g, $NaHCO_3$: 15 g, $H_2O$: 880 cc) | 13.04 |
| 11.6 wt % $Na_2CO_3$, 2.9 wt % $NaHCO_3$ ($Na_2CO_3$: 120 g, $NaHCO_3$: 30 g, $H_2O$: 880 cc) | 16.90 |

The results shown in FIG. 6 and TABLE 4 indicate that, although the reflectance can not be sufficiently decreased using merely an aqueous sodium carbonate ($Na_2CO_3$) solution under the condition of 12% by weight in the concentration and 95° C. in the temperature for 10 minutes, adding sodium bicarbonate ($NaHCO_3$) in this solution allows the reflectance to be decreased irrespective of the same etching condition, making it possible to save the etching time. The reason is not clear yet but the texture seems to be formed on the (111) surface of the wafer by being triggered with carbonate ions when the aqueous sodium carbonate solution is used for forming the textures. Adding sodium bicarbonate allows the carbonate ions to be increased without changing the pH value of the etching solution (pH of the aqueous sodium bicarbonate solution is neutral), thereby making it possible to form the textures within a short period of time since the (111) face is easily exposed.

While the concentration of sodium bicarbonate ($NaHCO_3$) is dependent on the concentration of sodium carbonate ($Na_2CO_3$), a concentration of 1 to 10% by weight is appropriate against the total weight of the etching solution.

Embodiment 4

Textures can be also formed by using an etching solution prepared by adding a small amount of sodium hydroxide (NaOH) to the aqueous sodium carbonate ($Na_2CO_3$) solution. Since the textures are also formed by using an etching solution prepared by adding sodium bicarbonate (NaHCO3) into the aqueous sodium carbonate ($Na_2CO_3$) solution, the textures are naturally formed by using a mixed solution of these three chemicals.

Embodiment 5

When the effect of potassium ions is compared with the effect of sodium ions, deterioration of characteristics due to contamination with impurities in the high temperature process after forming the textures is less affected by the former than by the latter because the former has a smaller diffusion coefficient than the latter in silicon. When the effect of potassium carbonate ($K_2CO_3$) is compared with the effect of sodium carbonate ($Na_2CO_3$), cleaning of the solar cell becomes easier when the former is used because the former has a higher solubility than the latter. For these reasons, sodium compounds are rarely used in the semiconductor process and, if textures are formed using sodium carbonate, post-treatment process becomes important.

The present embodiment refers to a method for washing silicon after etching with an acid. Applying this step after etching allows the solar cell to be more effectively produced with a low production cost. It was confirmed by the experiment that the solar cell has not been affected by washing the wafer twice with water after forming the textures after immersing it in an aqueous hydrofluoric acid solution (HF:$H_2O$=4:1). The same effect as described above can be obtained by using other acids such as hydrochloric acid (HCl) and nitric acid ($HNO_3$), or a RCA washing (washing method based on acids) that is widely used in the LSI process may be used. The concentration of acids is appropriately determined within a range not adversely affecting the performance of the solar cell.

According to the method of the present invention, textures are quite uniformly formed on the crystal faces without using isopropyl alcohol (IPA) as in the conventional art by using the aqueous sodium carbonate ($Na_2CO_3$) solution as an etching solution to form minute concave and convex textures on the surface of the silicon substrate, thereby allowing the solar cell having high performance to be produced with a low production cost.

According to the other embodiment of the present invention, the condition of the etching solution is optimized by adjusting the concentration of sodium carbonate ($Na_2CO_3$) to 8 to 23% by weight (a saturated aqueous solution), so that textures can be more uniformly formed on the crystal faces to allow the solar cell having high performance to be produced with a low production cost.

According to the other embodiment of the present invention, the condition of the etching solution is optimized by adjusting the temperature of the aqueous sodium carbonate ($Na_2CO_3$) solution to 80 to 100° C. so that textures can be more uniformly formed on the crystal faces to allow the solar cell having high performance to be produced with a low production cost.

According to the other embodiment of the present invention, a mixed solution of the aqueous sodium carbonate ($Na_2CO_3$) solution and aqueous sodium hydroxide (NaOH) solution is used as an etching solution, so that the problem of disposal of isopropyl alcohol as in the conventional art can be avoided, thus making it possible to produce the solar cell with a low production cost.

According to the other embodiment of the present invention, a mixed solution of the aqueous sodium carbonate ($Na_2CO_3$) solution and aqueous sodium bicarbonate ($NaHCO_3$) solution is used as the etching solution, so that quite uniform textures can be formed on the crystal faces without use of isopropyl alcohol (IPA) as in the conventional art, thereby allowing the solar cell to be effectively produced with a low production cost along with saving the etching time.

According to the other embodiment of the present invention, a mixed solution of the aqueous sodium carbonate ($Na_2CO_3$) solution, aqueous sodium bicarbonate ($NaHCO_3$) solution and aqueous sodium hydroxide (NaOH) solution is used for the etching solution, so that the solar cell can be effectively produced with a low production cost by avoiding the problem of disposal of isopropyl alcohol (IPA) as in the conventional art.

According to the other embodiment of the present invention, the silicon substrate is further immersed in an acid after forming minute concave and convex patterns on the silicon substrate, thereby allowing the solar cell to be more effectively produced with lower production cost.

What is claimed is:

1. A method for producing a solar cell comprising the step of immersing a silicon substrate into an etching solution to form minute concave and convex patterns on the surface of the silicon substrate, wherein the etching solution is an aqueous solution containing sodium carbonate ($Na_2CO_3$).

2. The method according to claim 1, wherein a concentration of sodium carbonate ($Na_2CO_3$) is 8 to 23% by weight (a saturated solution).

3. The method according to claim 1, wherein a temperature of the aqueous solution containing sodium carbonate ($Na_2CO_3$) is 80 to 100° C.

4. The method according to claim 1, wherein the etching solution is a mixed solution of the aqueous solution containing sodium carbonate ($Na_2CO_3$) and an aqueous solution containing sodium hydroxide (NaOH).

5. The method according to claim 1, wherein the etching solution is a mixed solution of the aqueous solution containing sodium carbonate ($Na_2CO_3$) and an aqueous solution containing sodium bicarbonate ($NaHCO_3$).

6. The method according to claim 1, wherein the etching solution is a mixed solution of the aqueous solution containing sodium carbonate ($Na_2CO_3$), aqueous solution containing sodium bicarbonate ($NaHCO_3$) and aqueous solution containing sodium hydroxide (NaOH).

7. The method according to claim 1, further comprising the step of immersing the silicon substrate in an acid after forming minute concave and convex patterns on the surface of the silicon substrate.

* * * * *